United States Patent [19]
Schmidt et al.

[11] Patent Number: 5,721,044
[45] Date of Patent: Feb. 24, 1998

[54] MULTIPLE SUBSTRATE

[76] Inventors: Karsten Schmidt, Kiebitzweg 26, D-04860 Torgau; Peter Maier, Hugo-Dietz-Strasse 19; Jürgen Schulz-Harder, Hugo-Dietz-Strasse 32, both of D-91207 Lauf, all of Germany

[21] Appl. No.: 599,234

[22] Filed: Feb. 9, 1996

[30] Foreign Application Priority Data

Feb. 9, 1995 [DE] Germany ............ 195 04 187.9
Feb. 10, 1995 [DE] Germany ............ 195 04 387.2

[51] Int. Cl.$^6$ ............................................. B32B 3/00
[52] U.S. Cl. ............................ 428/210; 428/209; 428/901
[58] Field of Search ............................ 428/209, 901, 428/210

[56] References Cited

U.S. PATENT DOCUMENTS 5,047,279  9/1991  Nasu et al. ............... 428/209
5,508,089  4/1996  Schulz-Harder ............ 428/209

FOREIGN PATENT DOCUMENTS 0149923  7/1985  European Pat. Off.

Primary Examiner—Patrick Ryan
Assistant Examiner—Cathy F. Lam
Attorney, Agent, or Firm—Hoffman, Wasson & Gitler

[57] ABSTRACT

A multiple substrate is provided having a large area individual base layer with multiple substrates, for electrical circuits formed thereon. Individual substrates are defined by score lines in the base layer, and include a fragment of the base layer and at least one metal coating is provided on at least one surface of the fragment and has areas which stabilize the multiple substrates against unwanted breaking. Several individual substrates are preformed along peripheral sides of the base layer, and at least one metal coating on each individual substrate projects over the peripheral side.

25 Claims, 5 Drawing Sheets

MULTIPLE SUBSTRATE

BACKGROUND OF THE INVENTION

1. Field of the Invention

The invention relates to a multiple substrate having a large-area insulating base layer with multiple individual substrates, for electrical circuits formed thereon. The individual substrates are defined by score lines in the base layer, and include a fragment of the base layer and at least one metal coating. The at least one metal coating is provided on at least one surface of fragment and has areas which stabilize the multiple substrates against unwanted breaking. Several individual substrates are formed along peripheral sides of the base layer, and at least one metal coating on each individual substrate projects over the peripheral side.

In particular, the invention relates to a multiple substrate which can be divided into a plurality of individual substrates for electrical substrates after completion of processing, especially by breaking on scored lines provided for this purpose.

BRIEF DESCRIPTION OF THE PRIOR ART

One multiple substrate of this type is known (EP 0 149 923).

In particular, ceramic substrates, also those which are produced as individual substrates of a multiple substrate, are used in electrical circuits, especially also in electric power circuits. Production of the individual substrates in multiple use or as individual substrates of a multiple substrate enabling not only especially efficient production of the individual substrates, but also enabling the individual substrates to be assembled with electrical components even before separating the multiple substrate so that production of electrical components is simplified.

It is problematic especially in substrates which have been produced as individual substrates of a multiple substrates that, after separation, i.e., after dividing the multiple substrate into individual substrates on each individual substrate, connection elements must be provided which project from the fragment of the original, i.e., divided insulating layer, the fragment forming the individual substrate, for connection of the electrical circuit formed by the individual substrate to an electrical connection, for example, formed on a printed circuit board. It is relatively expensive to attach these connection elements or terminal lugs and also requires additional relatively large soldering or contact surfaces so that the space available for other structures, for example for printed conductors, is reduced.

SUMMARY OF THE INVENTION

The object of the invention is to devise a multiple substrate which avoids the aforementioned disadvantages and which makes it possible to produce especially external connection elements for the individual substrates at the same time as the manufacture of the multiple substrate.

To achieve this object, a multiple substrate is provided having a large-area insulating base layer with multiple individual substrates, for electrical circuits formed thereon. The individual substrates are defined by score lines in the base layer, and include a fragment of the base layer and at least one metal coating. The at least one metal coating is provided on at least one surface of fragment and has areas which stabilize the multiple substrates against unwanted breaking. Several individual substrates are formed along peripheral sides of the base layer, and at least one metal coating on each individual substrate projects over the peripheral side.

One special advantage of the invention consists in that subsequent attachment of the connection elements or terminal lugs after manufacture of the individual substrates on the latter is abandoned.

DETAILED DESCRIPTION OF THE DRAWINGS

The invention is detailed in the following using the figures on exemplary embodiments.

DETAILED DESCRIPTION OF THE PREFERRED EMBODIMENTS

Figure 1:
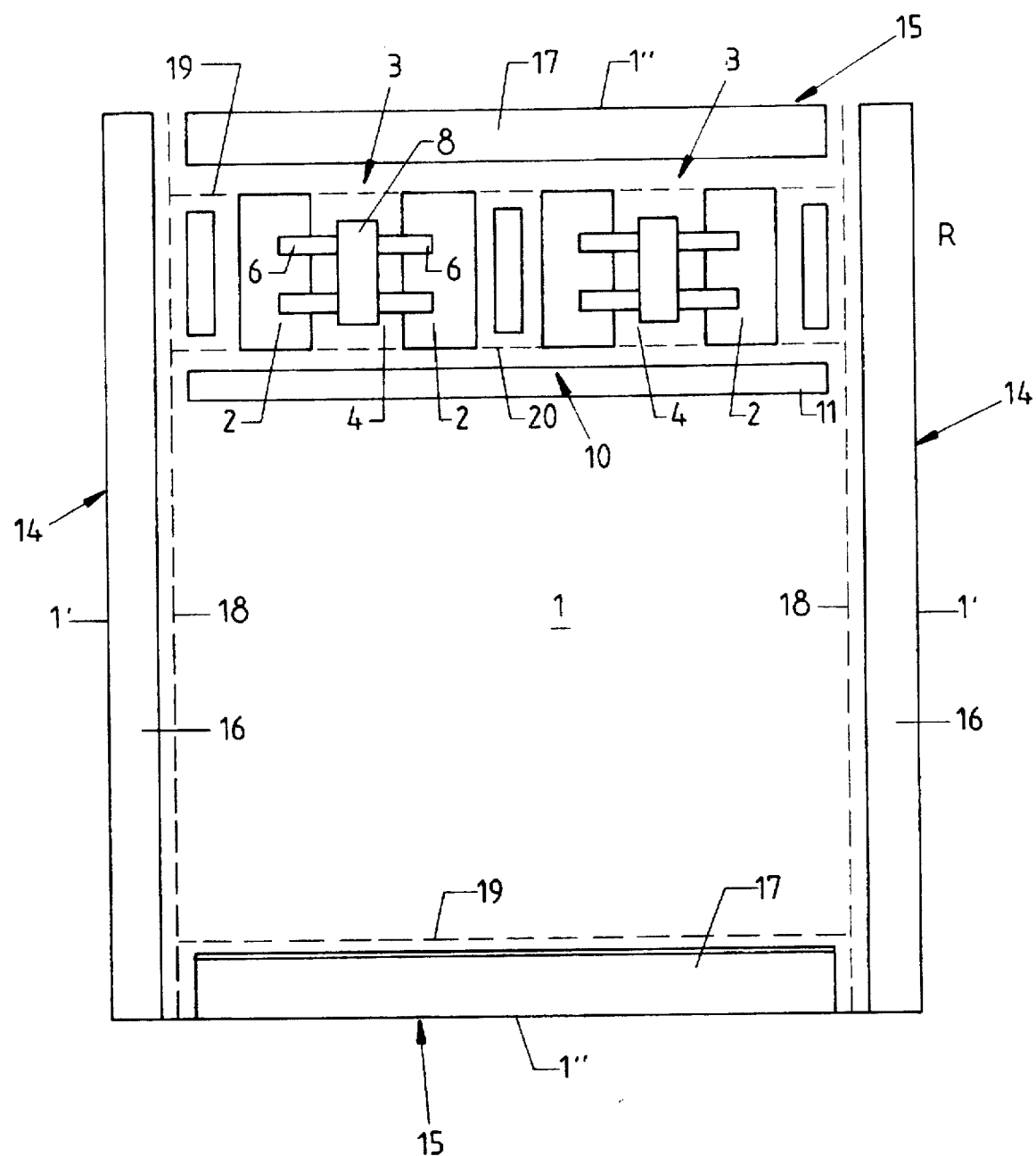
FIG. 1 shows in a simplified representation and in an overhead view a multiple substrate according to the invention.
Figure 2:
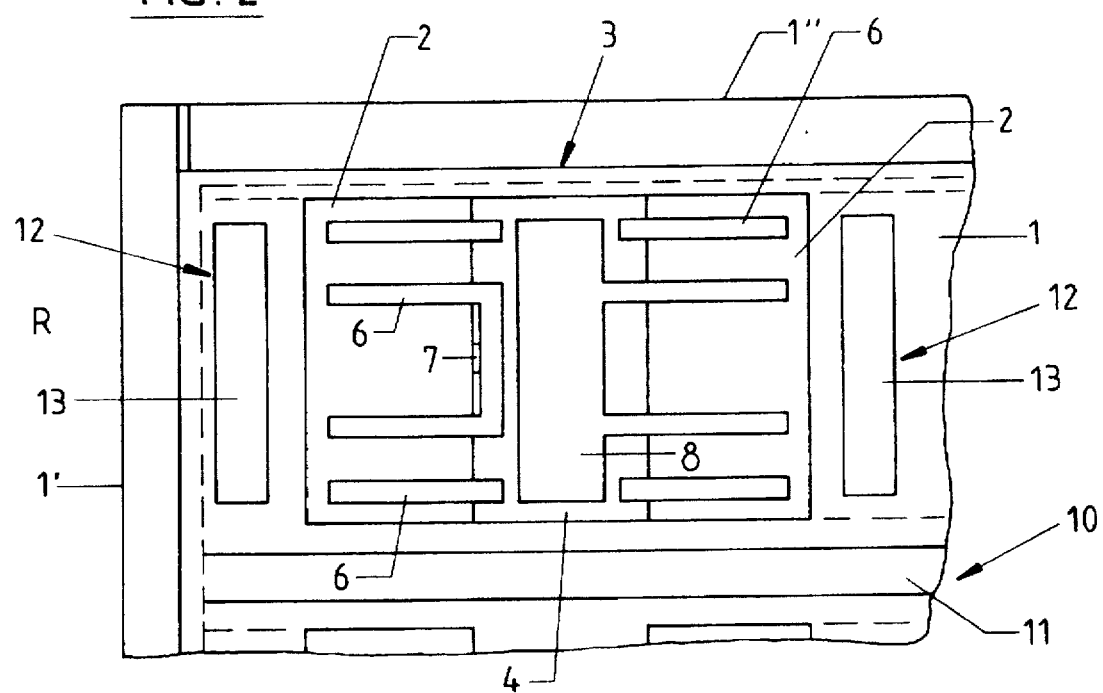
FIG. 2 shows in an enlarged representation and in an overhead view an individual substrate of the multiple substrate, together with the bordering stabilization areas or webs.
Figure 3:
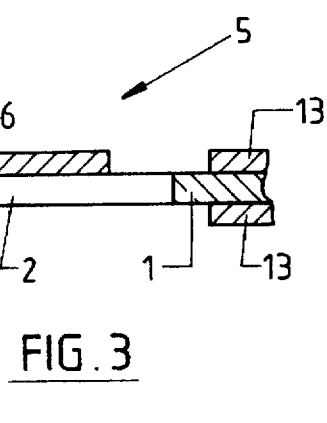
FIG. 3 shows a section according to line I—I of FIG. 2.

FIGS. 1–3 show a first embodiment of the multiple substrate according to the invention. This substrate is produced using a large-format, rectangular or quadratic ceramic plate or ceramic layer 1, with a layer thickness which is for example in the range between 0.2 and 1.5 mm and which is provided with a plurality of openings 2 which are made rectangular in the embodiment shown, with their longer sides parallel to peripheral sides 1' and with their shorter sides parallel to peripheral sides 1" if ceramic layer 1. Openings 2 are furthermore located in several rows R which extend each parallel to peripheral sides 1'. Ceramic layer 1 is preferably an aluminum oxide ceramic ($Al_2O_3$) or an aluminum nitride ceramic (AlN). Instead of ceramic layer 1 however a layer of another insulating material with high thermal conductivity, for example a layer of diamond, can also be used.

On ceramic layer 1 a plurality of individual substrates 3 is formed, each between two openings 2 which follow one another in row R. Each individual substrate 3 consists essentially of fragment 4 of ceramic layer 1 which is located between these two openings 2, on which (fragment) on the top of the multiple substrate or ceramic layer 1 there are strip-shaped connection elements 6 which are produced from a metal coating, for example, from copper layer 5 by structuring, which lie with their longitudinal extension in the direction of row R or parallel to peripheral sides 1", which are attached two dimensionally with a partial length on the top of the ceramic layer or on the top of part 4, and which project with a greater partial length over the edge of opening 2 into the latter. In addition to connection elements 6, each individual substrate 3 on the top of ceramic layer 1 has printed conductors and contact surfaces 7 and 8. It goes without saying that in itself the structuring or the layout of the metal coating on the top of ceramic layer 1 for individual substrates 3 can be executed for the respective application accordingly differently than is shown in FIGS. 1–3.

On the bottom of the multiple substrate in the area of each individual substrate 3 metal surface 9 is applied to ceramic layer 1 or to part 4 of this ceramic layer which forms the individual substrate.

Between individual rows R strips 10 are formed which stabilize the multiple substrate, which extend parallel to peripheral sides 1', and which traverse ceramic layer 1, especially by providing on these strips 10 ceramic layer 1 on its top and bottom each with strip-shaped metal surface 11.

In each row R, furthermore, stabilizing areas 12 are formed on the ceramic by applying strip-shaped metal surfaces 13 to the top and bottom of ceramic layer 1, said metal surfaces lying with their longitudinal extension parallel to peripheral sides 1' and lying in each row R with their ends congruently with the edges of openings 2, said edges running parallel to peripheral sides 1'.

Along peripheral sides 1 and 1' ceramic layer 1 is furthermore provided with stabilizing edge areas 14 (each along peripheral sides 1') and 15 (each along peripheral sides 1") which are likewise formed by providing the ceramic layer there on the top and bottom with strip-shaped metal layer 16 (edge areas 14) or 17, metal surfaces 16 on the top and bottom as well as metal surfaces 17 on the top and bottom each being the same size and lying congruently and, in the embodiment shown, metal surfaces 16 extending along two peripheral sides 1' over the entire length of these peripheral sides, while metal surfaces 17 are located between the upper and lower ends of metal surfaces 16 and end with a distance from metal surfaces 16.

The scored lines are labelled 18–20 and are produced for example by laser scribing or by means of another suitable technique in ceramic layer 1, and after completion of individual substrates 3 or after completion of other processing steps, for example after individual substrates 3 are assembled with electrical components etc., they enable separation of the multiple substrate into individual substrates by breaking.

The scored lines labelled 18 run along edge areas 14 and 15, i.e., these scored lines define the edge areas, in the embodiment shown scored lines 18 extending parallel to peripheral sides 1' from peripheral side 1" which is the top one in FIG. 1 to peripheral side 1" which is the lower one in this figure and scored lines 19 end parallel to peripheral sides 1" each on scored line 18. Scored lines 20 in the embodiment shown run parallel to peripheral sides 1", to each row R being assigned two such scored lines 20 and these scored lines 20 run exactly on the edges of openings 2, said edges lying parallel to peripheral sides 1".

The material used for connection elements 6, printed conductors 7, contact surfaces 8 and metal surfaces 9, 11, 13, 16 and 17, for example, copper or copper alloy, has a layer thickness which is in the range between 0.1 and 0.5 mm, the connection between and the ceramic and metal being produced using a technology known to one skilled in the art, for example by means of the DCB or AMB process.

With the version described the multiple substrate has sufficient strength which effectively prevents undesirable division of the multiple substrate into individual substrates 3 in conventional handling (for example, in structuring connection elements 6, printed conductors 7, contact surfaces 8 and/or during assembly, etc.).

One special advantage consists in that individual substrates 3 have connection elements 6 which project laterally over their electrically insulating layer (fragment 4) so that in this way both at the manufacturer of the multiple substrate and optionally individual substrates 3 as well as in further processing of the multiple substrate or individual substrates 3 costs can be reduced. Thus, due to projecting connection elements 6 for example at the subsequent processor costs for attaching (for example, soldering on) external connection elements are eliminated.

Furthermore, the available surface on the ceramic partial layer (fragment 4) of each individual substrate 3 can also be increased by projecting connection elements 6 since for example the contact or solder surfaces necessary for soldering on connection elements are eliminated.

Production of multiple substrate 1 takes place for example in several steps by first applying superficially a metal layer, for example, copper layer 21, using known DCB technology to ceramic layer 1 provided with openings 2 on the bottom of the substrate. From this copper layer then by means of etching technology or with another known structuring process metal surfaces 9, 11, 13, 16 and 17 which are provided on the bottom of the multiple substrate are produced.

Subsequently, to the top of ceramic layer 1 is likewise applied a metal layer, for example a copper layer, which then is likewise structured by means of a suitable and known technique to produce connection elements 6, printed conductors 7, contact surfaces 8 and metal surfaces 11, 13, 16, and 17.

Figure 4:
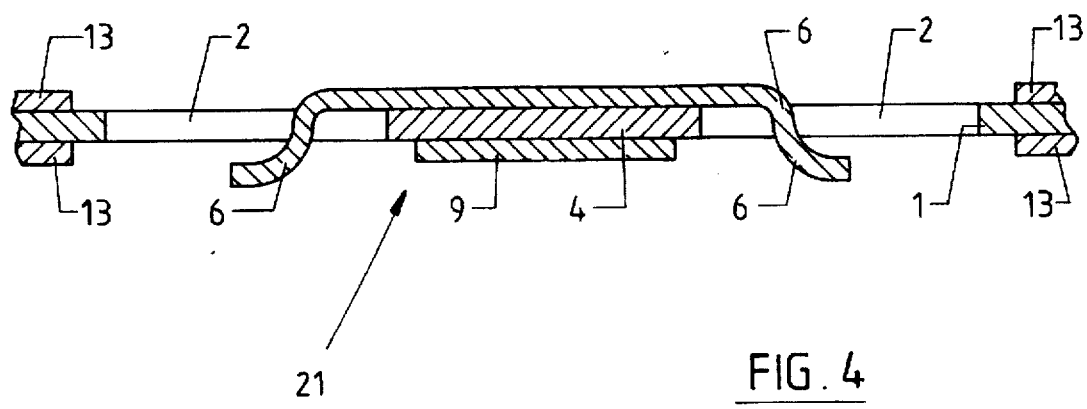
FIG. 4 shows a similar representation as FIG. 3, however in a somewhat altered embodiment.

FIG. 4 shows a modification of the multiple substrate of FIG. 1–3 in which projecting connection elements 6 are bent in individual substrates 3a in an S shape such that they lie with their free ends in a common plane with the bottom of metal surfaces 9.

FIG. 5 again shows in an individual representation individual substrate 3 and 3a after separation, i.e., after dividing the multiple substrate.

Figure 5:
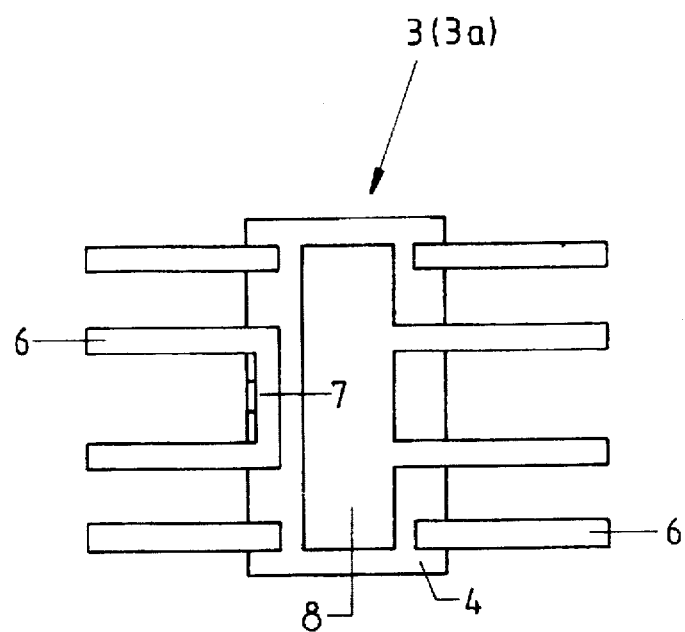
FIG. 5 shows a simplified individual substrate in an individual representation.

FIG. 5 shows an enlarged partial view a region of the multiple substrate which differs from the multiple substrate of FIG. 1 essentially in that with the exception of first and second opening 2 in each row R two individual substrates 3b are formed and provided on either side of each opening such that connection elements 6 of two individual substrates 3b which project into common opening 2 are offset in the direction of peripheral sides 1', i.e., transversely to the respective row R.

Accordingly, individual substrates 3b which follow one another in succession are each offset in row R. To obtain identical individual substrates 3b when the multiple substrate is divided additional scored lines 20' are provided in which, after separation on scored lines 20 on each individual substrate 3b, the second of the part of 4b of the ceramic layer assigned to each individual substrate 3b which is caused by the offset can be separated.

Figure 6:
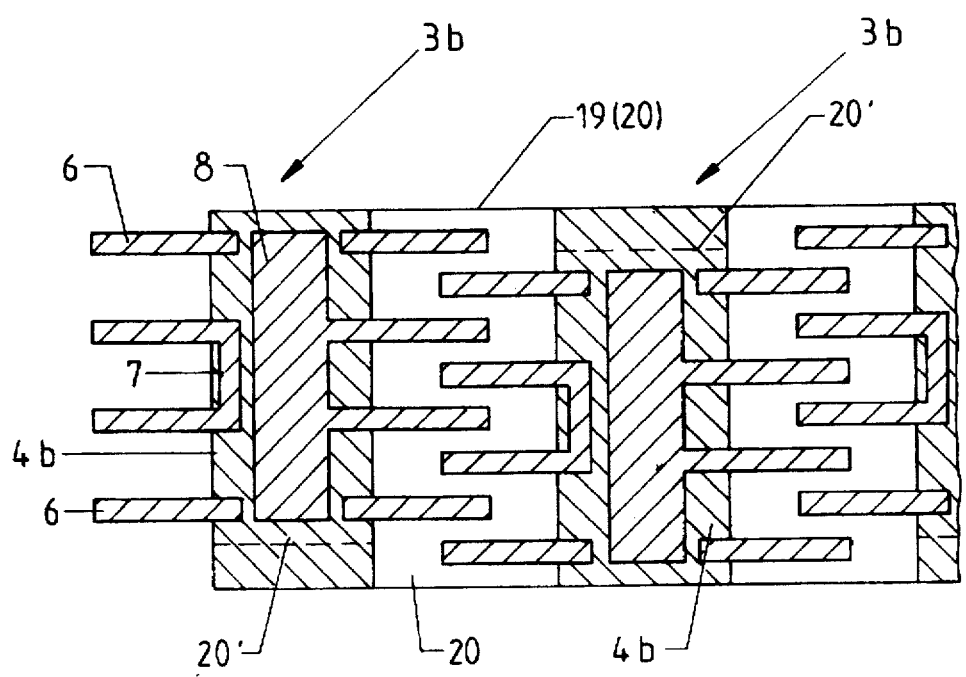
FIGS. 6 and 7 show similar representations as FIG. 2, however in other embodiments.

The multiple substrate of FIG. 6 allows a higher yield, i.e., this multiple substrate contains on the same surface a larger number of individual substrates 3b, in which the function of stabilizing areas 12 is each assumed by individual substrates 3b or their metal coatings (especially printed conductors 7, contact surfaces 8 and metal surfaces 9).

Figure 7:
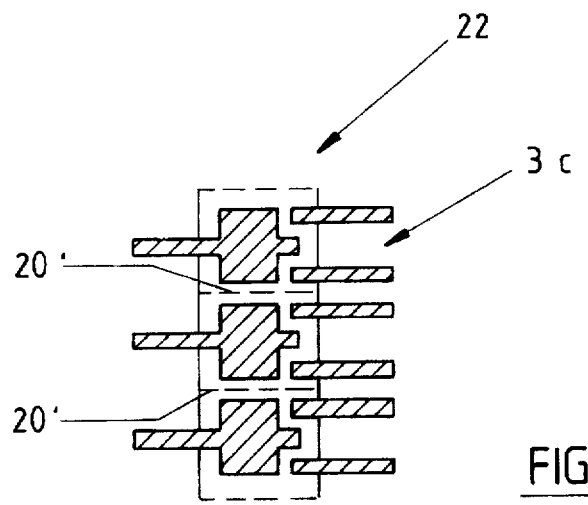

FIG. 7 shows unit 22 consisting of three individual substrates 3c. This unit 22 is formed for example in a multiple substrate in the same manner as was described above for individual substrates 3a and 3b, i.e., instead of these individual substrates, in the multiple substrate is unit 22 with additional scored lines 21' between individual substrates 3c.

Figure 8:
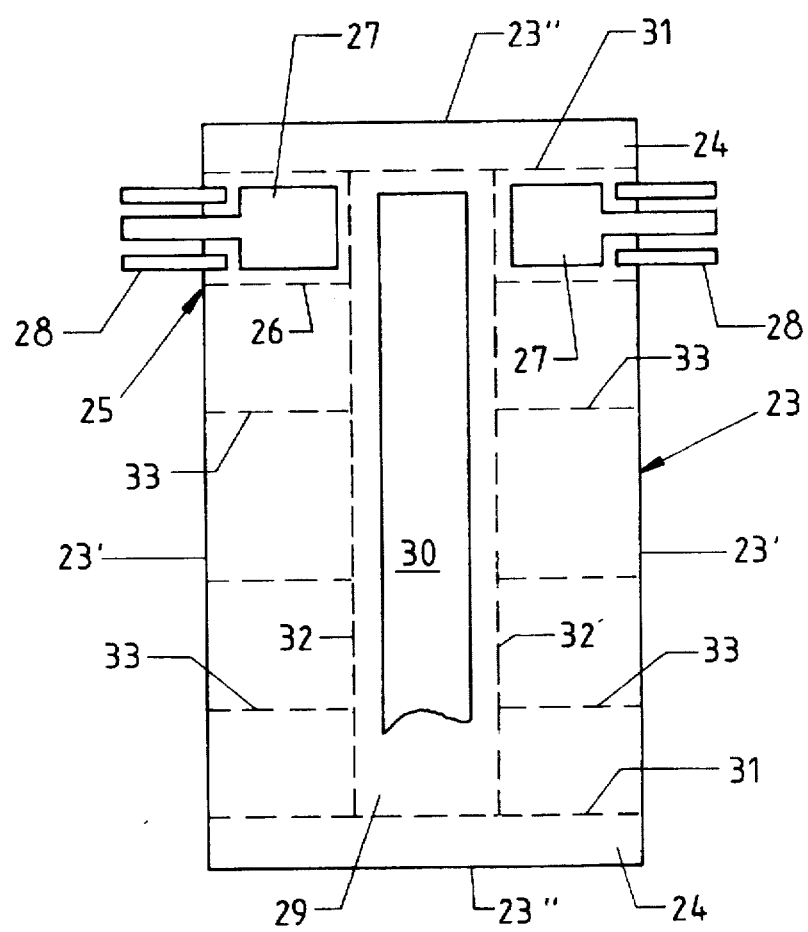
FIG. 8 shows another version of the multiple substrate according to the invention.

FIG. 8 finally shows as another possible embodiment of the invention a multiple substrate which consists of rectangular ceramic layer 23 with two longer peripheral sides 23' and two shorter peripheral sides 23". Along shorter peripheral sides 23" one stabilizing peripheral area at a time is formed by the fact that on the top and bottom of the ceramic layer one strip-shaped metal surface 24 is applied at a time and it extends over the entire length of peripheral side 23".

Along two peripheral side 23' several individual substrates 25 are formed in succession which each consists of fragment 26 of ceramic layer 23 which is quadratic in the embodiment shown and which is assigned to each individual substrate 25, of metal layer 27 which is provided on the top of the multiple substrate, and of connection elements 28 which lie with their longitudinal extension parallel to peripheral sides 23" and which project with the greater part of their length project over respective peripheral side 23'.

On the bottom of the multiple substrate each individual substrate 25 is provided preferably likewise with a metal surface.

Between individual substrates 25 on two peripheral sides 23' ceramic layer 23 forms stabilizing area 29 which likewise is provided on the top and bottom of the ceramic layer with a metal surface which ends at a distance from individual substrates 25 or the metal coatings there and also with a distance from the metal surfaces of reinforced peripheral area 24.

To break the multiple substrate into individual substrates 25 scored lines 31–34 are used in turn, specifically two scored line 31 with define peripheral areas 24 and which run parallel to peripheral sides 23", the scored lines which run parallel to peripheral sides 23', which delineate area 29 relative to individual substrates 25 and which are definitive in area 29, as well as the scored lines which run perpendicularly to peripheral sides 23' between individual substrates 25.

Connection elements 28 and all metal surfaces are produced for example by providing ceramic layer 23 on both sides with a metal surface, and in doing so on the top with metal surfaces which project over peripheral sides 23', for example, a copper layer using known techniques, for example, the DCB process. Then structuring of the two metal layers takes place with a likewise known technology (for example, etching technique).

Figure 9:
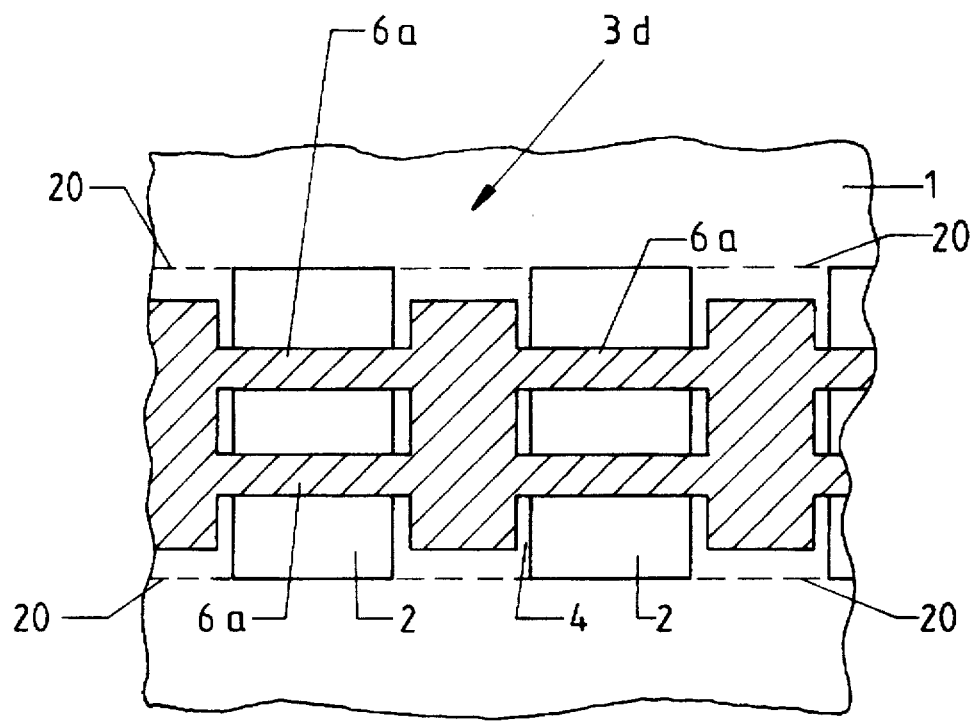
FIGS. 9 and 10 in a partial representation and overhead view and in a cutaway section show another possible embodiment of the multiple substrate according to the invention.
Figure 10:
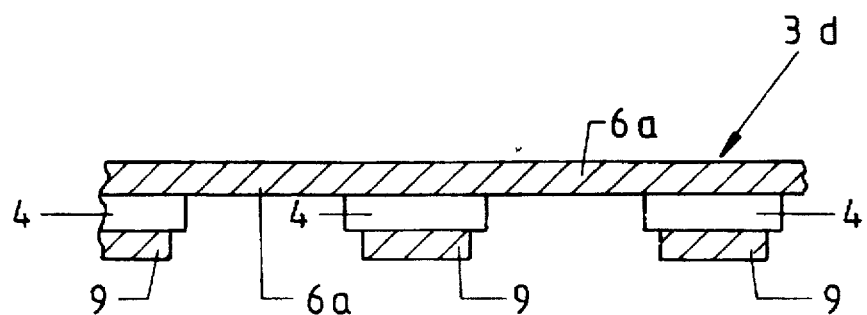

FIGS. 9 and 10 show in a partial view and in an overhead view as well as in cross section another embodiment of the multiple substrate according to the invention, which differs from the multiple substrate of FIG. 6 essentially only in that the individual substrates 3d are not provided offset and the strip-shaped metal coatings which form connection elements 6a of these substrates bridge the respective opening 2. The multiple substrate is separated in the manner described above in conjunction with FIGS. 1–7 by breaking ceramic layer 1 along scored lines 18–20. After this separation strips are obtained in which several individual substrates 3d are interconnected via the metal coatings which form connection elements 6a. Subsequently, these metal coatings are then divided mechanically, for example, by a punching process.

The thickness of the ceramic layer in the described embodiments is preferably in the range between 0.2–1.5 mm. The layer thickness of the metal surfaces is preferably in the range between 0.1 and 0.5 mm.

The stabilizing strip-shaped areas each have a width of at least 2 mm, at maximum a width of roughly 20 mm.

The invention was described above using embodiments. It goes without saying that changes and modifications are possible without departing from the idea underlying the invention. Thus, for example, it is possible that especially scored lines 18–20 and 31–34 also run slightly at an angle to the peripheral sides of the respective ceramic layer. It is furthermore possible to completely or partially abandon the metal coatings of the stabilizing areas, especially when respective ceramic layer 1 or 23 has sufficient mechanical strength.

Furthermore, it is also possible that the stabilizing areas with their metal coatings are used as individual substrates, then preferably the metal coatings there having a corresponding layout.

We claim:

1. A multiple substrate comprising:

a large-area insulating base layer, on which a plurality of individual substrates for electrical circuits are formed, defined by scored lines in said base layer and each of said plurality of individual substrates comprising one fragment of said base layer and of at least one metal coating each provided at least on one surface side of said respective fragment, areas on said base layer for stabilizing said multiple substrate against unwanted breaking, wherein said base layer has multiple openings, such that at least one edge line of said fragment of each of said plurality of individual substrates is formed at a time by an edge of one said multiple openings and said at least one metal coating of each of said plurality of individual substrates projects above said edge of one of said multiple openings into an area of said one of said multiple openings.

2. A multiple substrate according to claim 1, wherein said at least one metal coating of each of said plurality of individual substrates which projects into said one of said multiple openings has at least one connection element.

3. A multiple substrate according to claim 1, wherein on either side of said fragment of each of said plurality of individual substrates there is one of said multiple openings each.

4. A multiple substrate according to claim 1, wherein said multiple openings are provided in at least one row on said insulating layer, and two of said multiple openings at a time are assigned to each of said plurality of substrates, and wherein in said row of said multiple openings, one stabilizing region follows at least every two of said multiple openings.

5. A multiple substrate according to claim 1, wherein said multiple openings are formed in at least one row in succession in said base layer, and wherein on either side of each of said multiple openings, at most except for a first and last opening in said at least one row, one of said plurality of individual substrates is formed.

6. A multiple substrate according to claim 1, comprising stabilizing edge areas disposed along at least one peripheral side of said base layer.

7. A multiple substrate according to claim 1, wherein said multiple openings and said plurality of individual substrates are formed in several rows on said insulating layer, each of said several rows having at least two of said plurality of individual substrates, and wherein between adjacent rows is disposed one stabilizing strip-shaped area each.

8. A multiple substrate according to claim 1, wherein said base layer has a thickness of roughly 0.2–1.5 mm.

9. A multiple substrate according to claim 1, wherein a thickness of said at least one metal coating is roughly between 0.1–0.5 mm.

10. A multiple substrate according to claim 1, wherein said multiple openings have a quadratic or rectangular cross section.

11. A multiple substrate according to claim 1, wherein said base layer is a ceramic layer, an aluminum oxide or aluminum nitride ceramic.

12. A multiple substrate according to claim 1, wherein said base layer consists at least partially of diamond.

13. A multiple substrate according to claim 1, wherein said at least one metal coating is formed by a copper layer, preferably by a structured and/or surface treated copper layer.

14. A multiple substrate according to claim 1, wherein said at least one metal coating is disposed over a large area with said base layer by one direct copper bonding of technology and active soldering processes.

15. A multiple substrate comprising:
 - a large-area insulating base layer on which a plurality of individual substrates for electrical circuits are formed, defined by scored lines in said base layer, and each of said plurality of individual substrates comprising one fragment of said base layer and of at least one metal coating provided at least on one surface side of said respective fragment, stabilizing areas on said base layer for stabilizing said multiple substrate against unwanted breaking,
 - wherein along at least two peripheral sides of said base layer several of said plurality of individual substrates are formed, and
 - wherein each of said several of said plurality of individual substrates on said fragment of said base layer has said at least one metal coating which projects over one of said at least two peripheral sides.

16. A multiple substrate according to claim 15, wherein said stabilizing area is disposed in a middle of said base layer.

17. A multiple substrate according to claim 15, further comprising stabilizing edge areas along at least one of said at least two peripheral sides of said base layer.

18. A multiple substrate according to claim 15, wherein said base layer has a thickness of roughly 0.2–1.5 mm.

19. A multiple substrate according to claim 15, wherein a thickness of said at least one metal coating is roughly between 0.1–0.5 mm.

20. A multiple substrate according to claim 15, wherein said base layer is a ceramic layer.

21. A multiple substrate according to claim 15, wherein said base layer comprises at least partially of diamond.

22. A multiple substrate according to claim 15, wherein said at least one metal coating is formed by a copper layer.

23. A multiple substrate according to claim 15, wherein said at least one metal coating is disposed over a large area with said base layer by one of direct copper bonding technology and active soldering processes.

24. A multiple substrate according to claim 15, wherein said stabilizing areas are formed as individual substrates.

25. A multiple substrate according to claim 15, wherein said at least one metal coating of each individual substrate bridges one of said multiple openings.

\* \* \* \* \*